United States Patent
Siddiqui et al.

(10) Patent No.: US 9,741,720 B1
(45) Date of Patent: Aug. 22, 2017

(54) HIGHER 'K' GATE DIELECTRIC CAP FOR REPLACEMENT METAL GATE (RMG) FINFET DEVICES

(71) Applicant: GLOBALFOUNDRIES Inc., Grand Cayman (KY)

(72) Inventors: Shahab Siddiqui, Somers, NY (US); Balaji Kannan, Clifton Park, NY (US); Siddarth Krishnan, Newark, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/219,967

(22) Filed: Jul. 26, 2016

(51) Int. Cl.
- *H01L 27/092* (2006.01)
- *H01L 21/8238* (2006.01)
- *H01L 29/66* (2006.01)
- *H01L 29/51* (2006.01)
- *H01L 21/02* (2006.01)

(52) U.S. Cl.
CPC ...... *H01L 27/0924* (2013.01); *H01L 21/0228* (2013.01); *H01L 21/823821* (2013.01); *H01L 21/823857* (2013.01); *H01L 29/517* (2013.01); *H01L 29/66545* (2013.01)

(58) Field of Classification Search
CPC ..... H01L 21/823857; H01L 21/823821; H01L 21/0228; H01L 27/0924; H01L 29/517; H01L 29/66545

See application file for complete search history.

(56) References Cited

U.S. PATENT DOCUMENTS

| | | | |
|---|---|---|---|
| 9,331,168 B2* | 5/2016 | Lin | H01L 29/517 |
| 2010/0044798 A1* | 2/2010 | Hooker | H01L 21/823842 257/369 |
| 2010/0052072 A1* | 3/2010 | Li | H01L 27/0629 257/380 |
| 2010/0219481 A1* | 9/2010 | Tseng | H01L 21/28185 257/369 |
| 2013/0264652 A1* | 10/2013 | Zhu | H01L 21/28088 257/369 |
| 2015/0206951 A1* | 7/2015 | Lin | H01L 29/517 257/411 |
| 2015/0214319 A1* | 7/2015 | Li | H01L 29/4966 257/288 |
| 2015/0255557 A1* | 9/2015 | Zhu | H01L 29/78 257/372 |
| 2016/0365347 A1* | 12/2016 | Bao | H01L 27/0924 |

* cited by examiner

*Primary Examiner* — Christine Enad
(74) *Attorney, Agent, or Firm* — Wayne F. Reinke, Esq.; Heslin Rothenberg Farley & Mesiti P.C.

(57) ABSTRACT

A semiconductor structure includes a semiconductor substrate, n-type and p-type FinFETs on the substrate, each of the n-type and the p-type FinFETs include a channel region and a gate structure surrounding the channel region, each gate structure having a phase-changed high-k gate dielectric layer lining a gate trench thereof, the gate trench defined by a pair of spacers. The semiconductor structure further includes a conformal dielectric capping layer over each phase-changed high-k gate dielectric layer, the conformal dielectric capping layer having a higher dielectric constant than the phase-changed high-k gate dielectric layer. Further included on the n-type FinFETs is a multi-layer replacement gate stack of n-type work function material over the phase-changed high-k gate dielectric layer. A method of fabricating the semiconductor structure is also provided.

18 Claims, 7 Drawing Sheets

(12) United States Patent
US 9,741,720 B1

HIGHER 'K' GATE DIELECTRIC CAP FOR REPLACEMENT METAL GATE (RMG) FINFET DEVICES

BACKGROUND OF THE INVENTION

Technical Field

The present invention generally relates to co-fabricating n-type and p-type transistors. More particularly, the present invention relates to enablement of higher 'k' gate dielectric cap in RMG FINFET structure as well as method of reducing or eliminating gate stack sidewall defects when co-fabricating n-type and p-type transistors.

Background Information

When co-fabricating n-type and p-type transistors on a same substrate, a gate stack that is suitable, for example, for n-type transistors may first be formed over both an n-type transistor region and a p-type transistor region of the substrate. The process may then be followed by the removal of a portion of the gate stack over the p-type transistors, which may consequently cause defects in the sidewall of the remaining gate stack over the n-type transistors. These defects may, as a result, affect the performance of subsequently formed n-type transistors.

SUMMARY

Thus, a need exists to reduce or eliminate such defects.

The present invention reduces or eliminates gate stack sidewall defects due to p-type gate stack removal while also co-fabricating n-type and p-type transistors.

In one aspect, provided is a method. The method includes, in a FinFET replacement metal gate process after removal of dummy gates, providing a starting semiconductor structure, the starting semiconductor structure including a semiconductor substrate, at least one fin for at least one n-type transistor and at least one fin for at least one p-type transistor, each of the at least one fin for the at least one n-type transistor and the at least one fin for the at least one p-type transistor including a partial gate structure surrounding a channel region thereof and dielectric material surrounding source and drain regions thereof, each partial gate structure including spacers and a high-k gate dielectric layer lining gate trenches. The method further includes causing a phase change in each high-k gate dielectric layer, resulting in a phase-changed high-k gate dielectric layer, forming a multi-layer replacement gate stack of n-type work function materials over the phase-changed high-k gate dielectric layer for the at least one fin for the at least one n-type transistor, forming a conformal dielectric capping layer over the multi-layer replacement gate stack for the at least one n-type transistor and over the phase-changed high-k gate dielectric layer for the at least one p-type transistor, the conformal dielectric capping layer having a dielectric constant higher than that of the phase-changed high-k dielectric layer, and finishing forming the at least one n-type transistor and the at least one p-type transistor.

In accordance with another aspect, a semiconductor structure is provided. The semiconductor structure includes a semiconductor substrate, at least one n-type FinFET on the substrate, and at least one p-type FinFET on the substrate. Each of the at least one n-type FinFET and the at least one p-type FinFET includes a channel region and a gate structure surrounding the channel region, each gate structure having a phase-changed high-k gate dielectric layer lining a gate trench thereof, the gate trench defined by a pair of spacers. The semiconductor structure further includes a conformal dielectric capping layer over each phase-changed high-k gate dielectric layer, the conformal dielectric capping layer having a higher dielectric constant than the phase-changed high-k gate dielectric layer, and the n-type FinFET including a multi-layer replacement gate stack over the phase-changed high-k dielectric layer, and the conformal dielectric capping layer for the n-type FinFET being over the multi-layer replacement gate stack.

These, and other objects, features and advantages of this invention will become apparent from the following detailed description of the various aspects of the invention taken in conjunction with the accompanying drawings.

BRIEF DESCRIPTION OF THE DRAWINGS

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

In accordance with one or more aspects of the present invention.

FIGS. 11-15, 17 and 18 track the process flow of FIGS. 3-10, except showing cross-sectional views along lines A-A and A'-A' of FIG. 1.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

Figure 1:
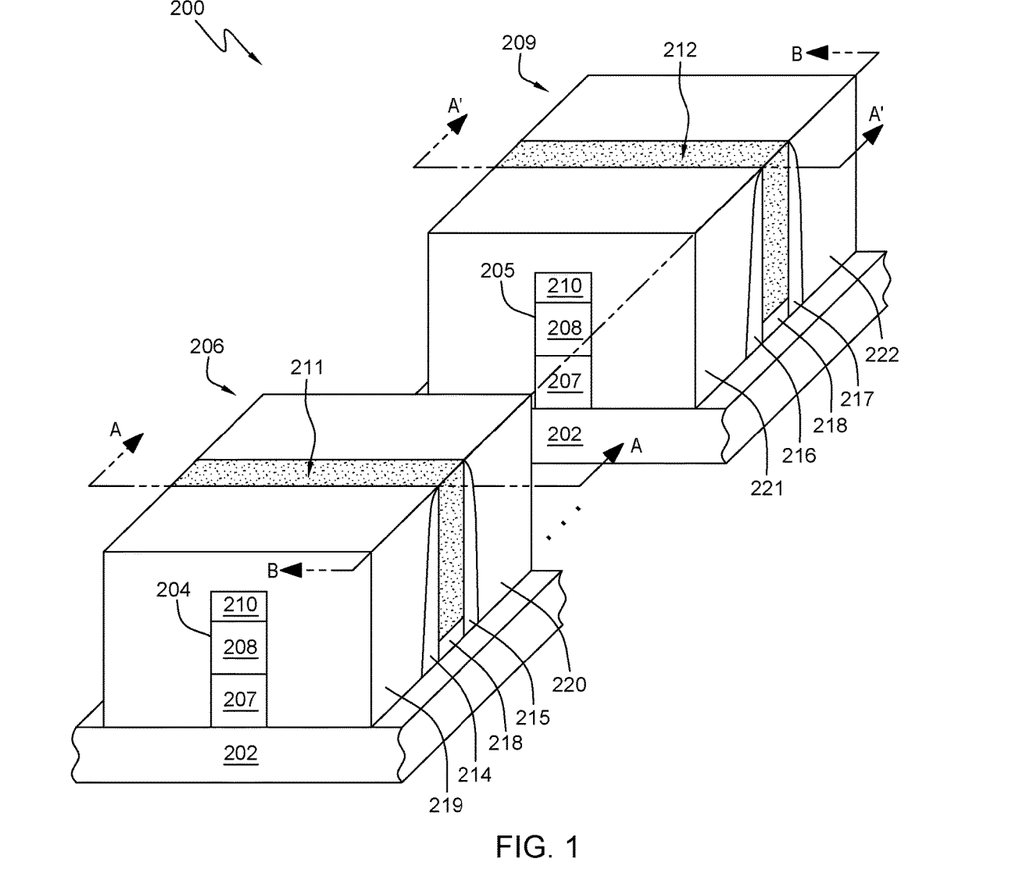
FIG. 1 is a perspective view of one example of a starting semiconductor structure, the starting semiconductor structure including a semiconductor substrate and fins (n-type) and (p-type) formed on top of the substrate, each fin including a bottom region, an active region, and a top dielectric layer, a gate trench for each fin, spacer pairs on either side of each gate trench, respectively, and a gate dielectric layer at the bottom of each gate trench, the fins each surrounded by two dielectric layers, adjacent each spacer pair. Note that, although the n-type and p-type transistors are shown together in FIG. 1 for ease of understanding, they are actually in different regions of the substrate.

In accordance with one or more aspects of the present invention, FIG. 1 is a perspective view of one example of a starting semiconductor structure 200, the starting semiconductor structure including a semiconductor substrate 202 and fins (e.g., fin 204) for n-type transistors and fins (e.g., fin 205) for p-type transistors, formed on top of the substrate, each fin including a bottom inactive region 207, an active region 208, and a top dielectric layer 210, a gate trench (211, 212) for each fin, spacer pairs 214, 215 and 216, 217 on either side of each gate trench 211 and 212, respectively, and a gate dielectric layer 218 (e.g., a high-k dielectric having a dielectric constant k >3.9) at the bottom of each gate trench, the fins each surrounded by two dielectric layers 219, 220 and 221, 222 (e.g., dielectric layers 220 and 222), adjacent each spacer pair. Note that, although the n-type and p-type transistors are shown together in FIG. 1 for ease of understanding, they may also be in different regions of the substrate.

The starting structure may be conventionally fabricated, for example, using known processes and techniques. However, although only a portion of the structures are shown in FIG. 1, for simplicity, it will be understood that, in practice, many such structures are typically included on the same substrate.

In one example, substrate 202 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 202 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the gate dielectric layer 218 may include, for example, hafnium oxide (HfOx).

Figure 2:
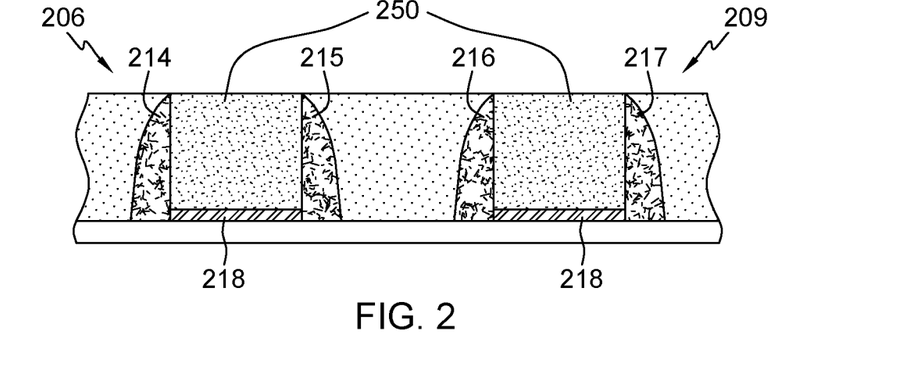
FIG. 2 is a cross-sectional view taken across line B-B in FIG. 1 showing one example of dummy gate structures. Each dummy gate structure includes spacer pairs, a gate dielectric layer and a dummy gate material filling the gate trenches.

In accordance with one or more aspects of the present invention, FIG. 2 is a cross-sectional view taken across line B-B in FIG. 1 showing one example of dummy gate structures 206 and 209. Each dummy gate structure includes spacer pairs 214, 215 and 216, 217, a gate dielectric layer 218 and a dummy gate material (e.g., poly silicon) 250 filling the gate trenches.

Figure 3:
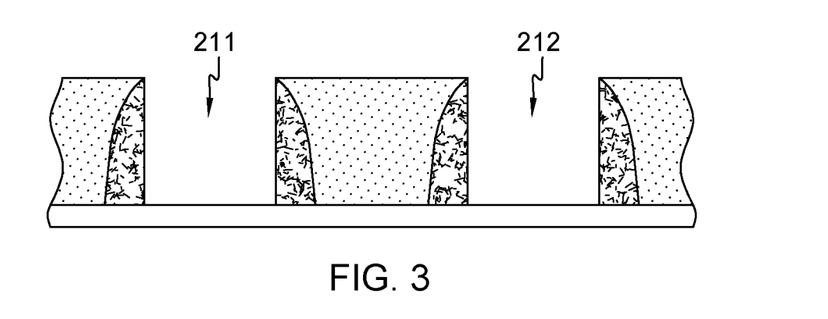
FIG. 3 depicts one example of the gate trenches opened after removing the dummy gate material and the gate dielectric layers of FIG. 2.

In accordance with one or more aspects of the present invention, FIG. 3 depicts one example of the gate trenches 211, 212 opened after removing the dummy gate material and the gate dielectric layers of FIG. 2.

FIGS. 11-15, 17 and 18 track the process flow of FIGS. 3-10, except showing cross-sectional views along lines A-A and A'-A' of FIG. 1.

Figure 11:
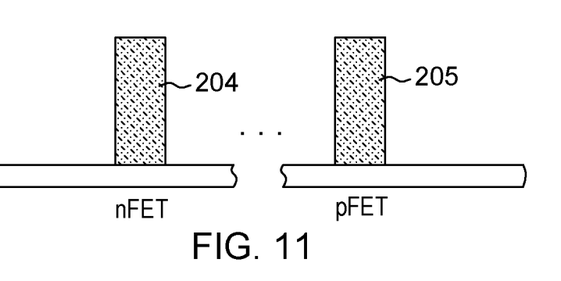

In that regard, FIG. 11 corresponds to the point in fabrication of FIG. 3 and depicts one example of the n-type and p-type fins 204 and 205, respectively, after the dummy gate material and gate dielectric layer are removed.

Figure 4:
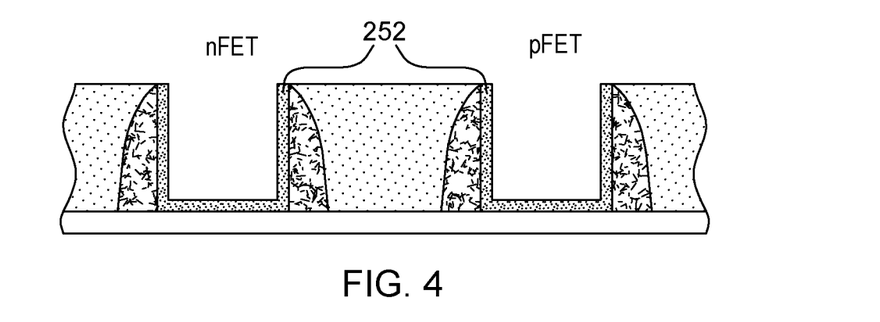
FIG. 4 depicts one example of forming a high-k dielectric layer in the gate trenches of FIG. 3.

In accordance with one or more aspects of the present invention, FIG. 4 depicts one example of forming a gate dielectric layer 252 (e.g., high-k dielectric; in this case, sacrificial) in the gate trenches of FIG. 3.

Figure 5:
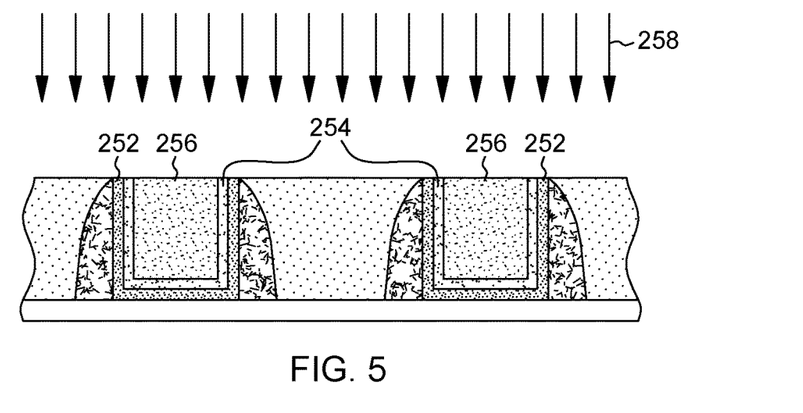
FIG. 5 depicts one example of forming a metal cap layer (e.g., titanium nitride) over the high-k dielectric layer of FIG. 4, filling the gate trenches with a filler material (e.g., amorphous silicon), and subjecting the structure to an anneal process. In one example, the anneal process may take the form of a two-step process: first, a spike anneal at about 970 degrees Celsius, followed second by a 1250 degree Celsius laser anneal. The anneal process results in a phase change of the high-k dielectric layer that preserves the same.

In accordance with one or more aspects of the present invention, FIG. 5 depicts one example of forming a metal cap layer 254 (e.g., titanium nitride) over the gate dielectric layer 252 of FIG. 4, filling the gate trenches with a filler material 256 (e.g., amorphous silicon), and subjecting the structure to an anneal process 258. In one example, the anneal process may take the form of a two-step process: first, a spike anneal at about 970 degrees Celsius, followed second by a 1250 degree Celsius laser anneal. The anneal process results in a phase change of the high-k dielectric layer 252, which makes it more amorphous. This phase change of the high-k dielectric layer (e.g., HfOx) inhibits oxygen diffusion from the higher-k dielectric capping process (e.g., TiOx), described with regard to FIG. 9, to the high-k dielectric silicon interface. Without the change in phase, the higher-k dielectric process generally grows a thin interfacial layer at the interface, leading to an increase in equivalent oxide thickness (EOT) and performance degradation. The presence of the higher-k dielectric improves leakage, but at the cost of performance degradation.

In another example, where the high-k gate dielectric layer 252 is hafnium oxide (HfOx), the gate dielectric phase change may be achieved by, for example, depositing a sacrificial amorphous silicon layer and metal cap (e.g., TiN) 254 and annealing 258 at high temperature (900° C.-1200° C.) to change the HfOx phase from crystalline to amorphous. After annealing, the sacrificial amorphous silicon and titanium nitride cap may be removed using, e.g., wet chemistries. Thereafter, nitrogen is introduced such that the dielectric layer becomes hafnium oxy-nitride. In one example, the nitrogen may be introduced using, for example, a plasma nitridation process using Nitrogen or Ammonia gas.

Figure 12:
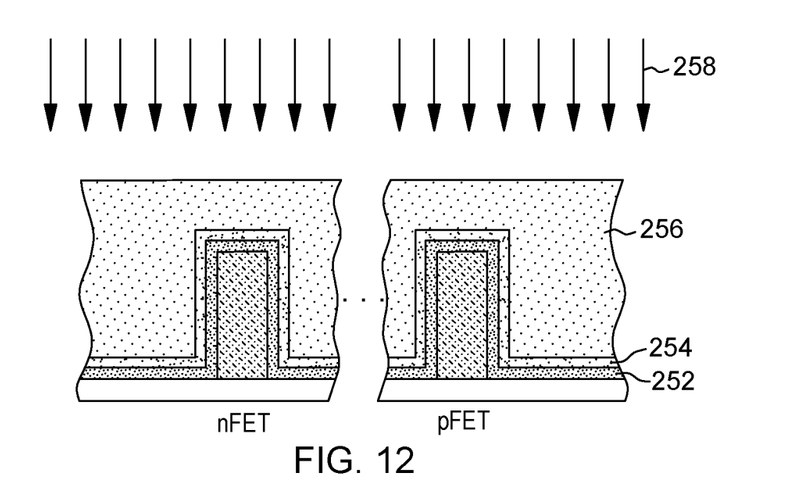
FIG. 12 corresponds to FIGS. 4 and 5, i.e., forming the high-k gate dielectric layer, the metal cap layer and the gate filler material, the structure then being subjected to the anneal process to phase-change the gate dielectric layer.

FIG. 12 corresponds to FIGS. 4 and 5, i.e., forming the gate dielectric layer 252, the metal cap layer 254 and the gate filler material 256, the structure then being subjected to the anneal process 258 of FIG. 5 to phase-change the gate dielectric layer.

Figure 6:
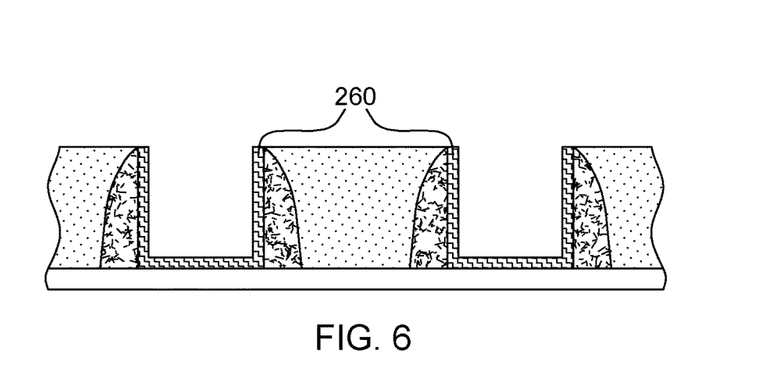
FIG. 6 depicts one example of the phase-changed high-k dielectric layer after removal of the filler material and the metal cap.

In accordance with one or more aspects of the present invention, FIG. 6 depicts one example of the phase-changed gate dielectric layer 260 after removal of the filler material.

Figure 13:
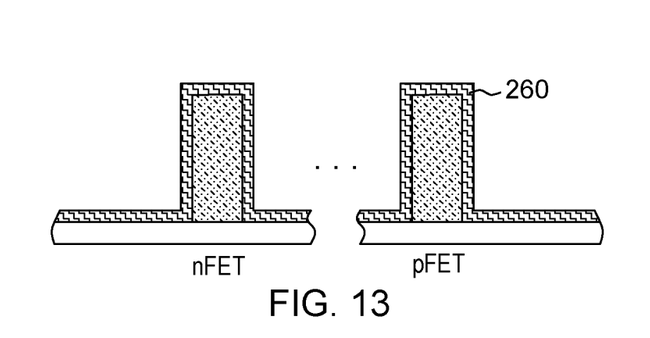
FIG. 13 corresponds to FIG. 6, showing only the phase-changed gate dielectric layer over the fins.

FIG. 13 corresponds to FIG. 6, showing only the phase-changed gate dielectric layer 260 over the fins.

Figure 7:
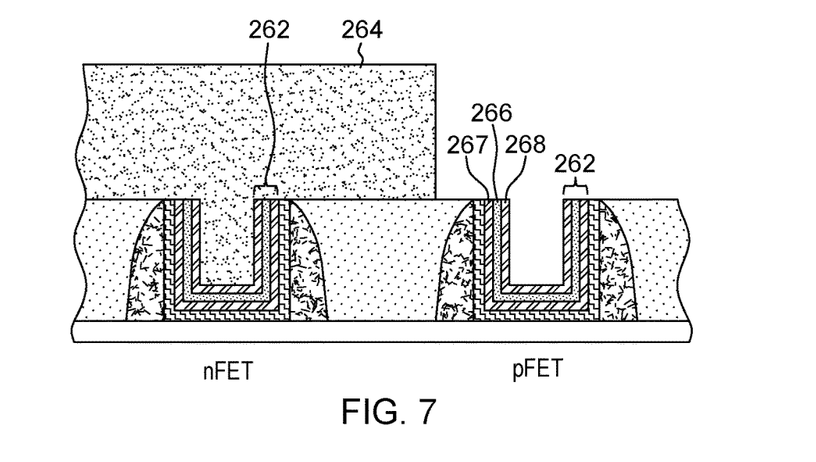
FIG. 7 depicts one example of forming a multi-layer n-type work function layer and blocking the n-type structure over the phase-changed high-k dielectric layer of FIG. 6. In one example, the multi-layer n-type work function layer includes a layer of titanium aluminum carbon sandwiched between two layers of titanium nitride.

In accordance with one or more aspects of the present invention, FIG. 7 depicts one example of forming a multi-layer n-type work function layer 262 and then blocking 264 the n-type structure over the phase-changed gate dielectric layer of FIG. 6. In one example, the multi-layer n-type work function layer includes a layer 266 of titanium aluminum carbon sandwiched between two layers 267, 268 of titanium nitride.

Figure 14:
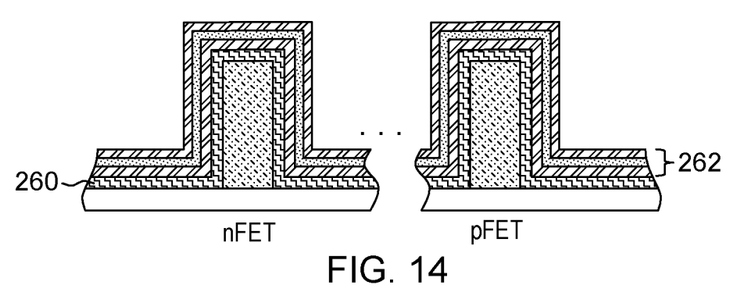
FIG. 14 corresponds to FIG. 7, showing the multi-layer n-type work function material formed over the phase-changed gate dielectric layer.

FIG. 14 corresponds to FIG. 7, showing the multi-layer n-type work function material 262 formed over the phase-changed gate dielectric layer 260.

Figure 8:
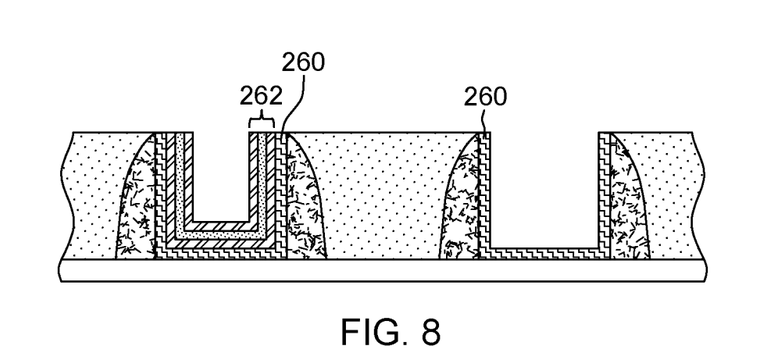
FIG. 8 depicts one example of the n-type structure with the multi-layer n-type work function material, and the p-type structure have only the phase-changed layer of high-k material after removal of the multi-layer n-type work function material from the p-type structure and removal of the blocking material (e.g., photo resist) from the structure of FIG. 7.

In accordance with one or more aspects of the present invention, FIG. 8 depicts one example of the n-type structure with the multi-layer n-type work function material 262, and the p-type structure have only the phase-changed layer of high-k material after removal of the multi-layer n-type work function material from the p-type structure and removal of the blocking material from the structure of FIG. 7.

Figure 15:
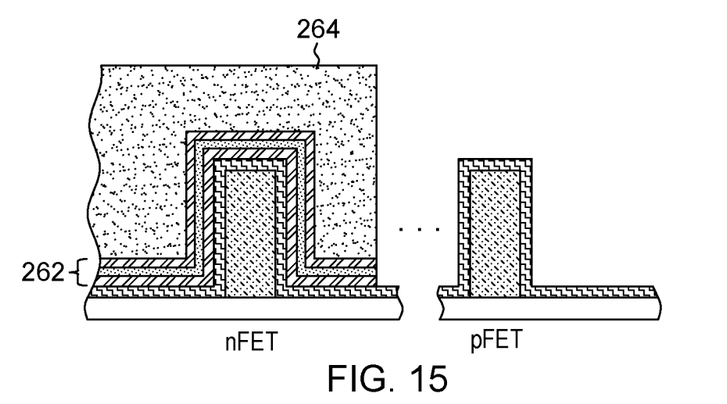
FIG. 15 corresponds to FIG. 8, showing the multi-layer n-type work function material removed from the p-type structure and the blocking material formed over the n-type structure.

FIG. 15 corresponds to FIG. 8, showing the multi-layer n-type work function material 262 removed from the p-type structure and the blocking material 264 formed over the n-type structure.

Figure 16:
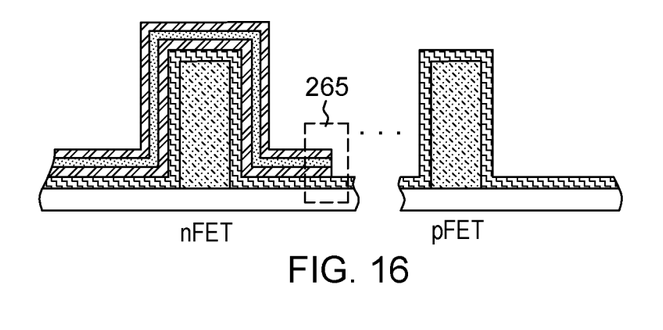
FIG. 16 also corresponds to FIG. 8 showing the blocking material removed, and emphasizing that at the end of the multi-layer n-type work function material exists a potential gate leakage path.

FIG. 16 also corresponds to FIG. 8 showing the blocking material 264 removed, and emphasizing that at the end 265 of the multi-layer n-type work function material 262 exists a potential gate leakage path.

Figure 9:
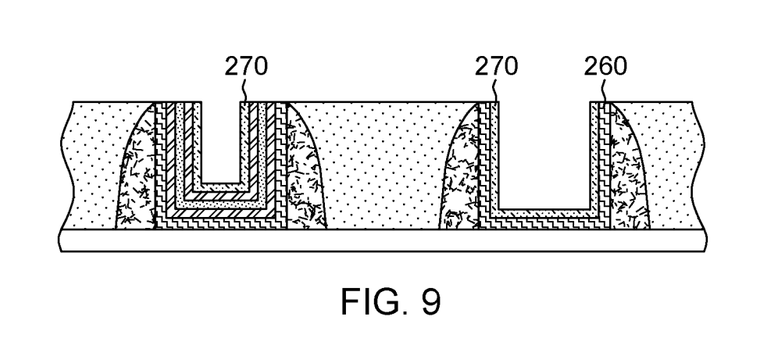
FIG. 9 depicts one example of forming a high-k dielectric cap over the multi-layer n-type work function layer of FIG. 8, the higher-k dielectric cap (e.g., TiOx) also being formed over the phase-changed high-k dielectric layer of the p-type structure of FIG. 8. As noted previously, dielectric cap 270 has a higher k value than the phase-changed gate dielectric. The higher k allows for the deposition of a thicker gate oxide, an improvement in gate leakage is realized.

In accordance with one or more aspects of the present invention, FIG. 9 depicts one example of forming a dielectric cap 270 (e.g., high-k such as TiOx) over the multi-layer n-type work function layer 262 of FIG. 8, the dielectric cap also being formed over the phase-changed gate dielectric layer 260 of the p-type structure of FIG. 8. Note that the dielectric cap should have a higher dielectric constant than the phase-changed gate dielectric layer for the reasons described below.

Figure 17:
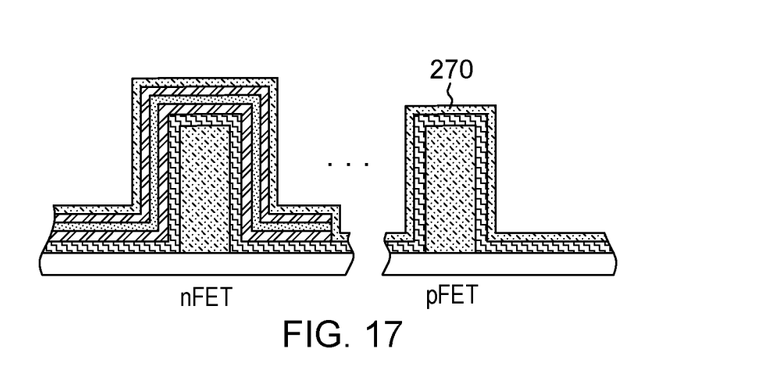
FIG. 17 corresponds to FIG. 9, showing the higher-k dielectric cap over both structure types.

FIG. 17 corresponds to FIG. 9, showing the high-k dielectric cap over both structure types. Thus, the combination of phase change and the higher-k capping layer prevents the degradation and the aforementioned sidewall damage.

In one example, where the higher-k dielectric layer includes TiOx, it may be deposited using an atomic layer deposition oxide process at a deposition temperature range of about 200 C to about 300 C. For example, a TiCl$_4$/H$_2$O process may be used to deposit TiOx. A thickness range for the TiOx cap is about 3 Angstroms to about 8 Angstroms.

Higher k materials such as, for example, TiOx, cannot be deposited directly on a silicon channel, as the bandgap of silicon and TiOx is well matched (in other words, conduction bands are not mismatched). This leads to increased leakage as electrons tunnel through the gate oxide, even though TiOx has one of the highest k values. The combination of HfOx/TiOx allows for working around this problem, where HfOx provides enough mismatch between and the HfOx conduction band (offset), while TiOx provides an effective k value increase (HfOx+TiOx), leading to an overall improvement in gate leakage.

Figure 10:
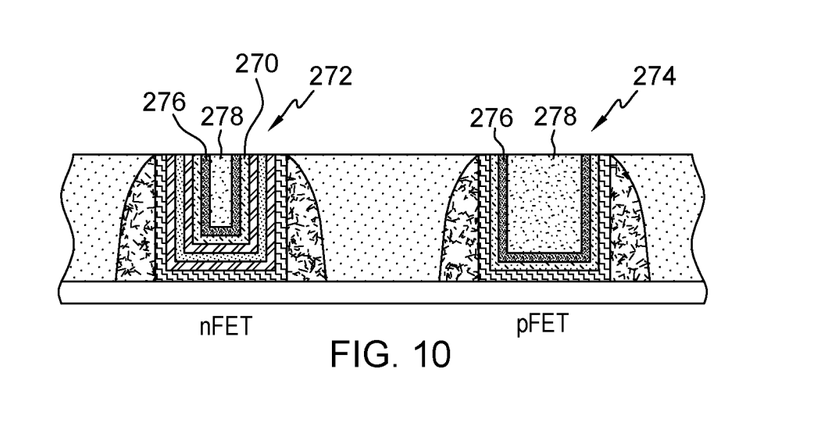
FIG. 10 depicts one example of finished gate structures for the n-type structure and the p-type structure, respectively. A layer of p-type work function material (e.g., titanium nitride) is formed over the high-k dielectric cap of FIG. 9, and then the gates are filled with a conductive material (e.g., tungsten).

In accordance with one or more aspects of the present invention, FIG. 10 depicts one example of finished gate structures 272, 274 for the n-type structure and the p-type structure, respectively. A layer of p-type work function material 276 (e.g., titanium nitride) is formed over the high-k dielectric cap 270 of FIG. 9, and then the gates are filled with a conductive material 278 (e.g., tungsten).

Figure 18:
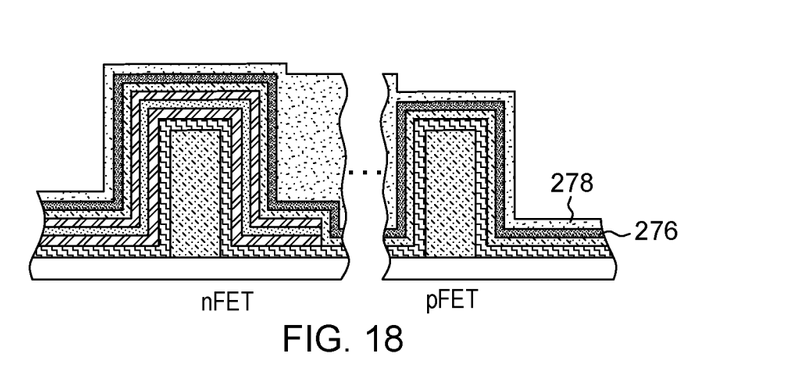
FIG. 18 corresponds to FIG. 10, showing the finished gate electrodes with respect to the fins, including p-type work function layer and conductive material.

FIG. 18 corresponds to FIG. 10, showing the finished gate electrodes with respect to the fins, including p-type work function layer 276 and conductive material 278.

In one example, protective layer 212 may include, for example, a lithographic blocking material (e.g., photoresist). Further, the protective layer may be blanket at first, then removed over the p-type transistor.

Layer 218 has a higher dielectric constant than layer 208 in order to produce effective higher-k dielectric gate oxide, leading to improved leakage as equivalent oxide thickness (EOT) is scaled. A higher-k dielectric using, e.g., TiOx, is situated on top of HfOx instead of directly on silicon for the following reasons. The TiOx band gap is closely matched to Si, hence, there is no energy barrier between silicon and TiOx conduction band, allowing electrons in Silicon conduction band to transport through TiOx gate dielectric (TiOx conduction band) leading to increased gate leakage, regardless of TiOx having a higher dielectric constant. Bottom HfOx/Top TiOx bi-layer provides a mismatch with the conduction band, providing a barrier for electrons leading to reduced leakage, at the same time, phase changed HfOx (highly amorphous) at nano-scale level prevents oxygen diffusion from TiOx process through HfOx. This mechanism prevents regrowth of interfacial layer at Silicon/HfOx interface, leading to effective higher-k gate dielectric which has reduced leakage at scaled EOT.

In one example, forming the capping layer may be accomplished by directly depositing the same, for example, using an atomic layer deposition (ALD) process. In another example, dielectric capping layer 270 may include, for example, titanium oxide (TiOx).

One or more aspects of the present invention includes forming conformal blanket p-type work function layer(s) 276 (e.g., titanium nitride) over the conformal dielectric capping layer 270, starting from the structure of FIG. 8 to result in the structure of FIG. 9. Layer 270 needs to be conformal using, for example, an Atomic Layer Deposition (ALD) process. These films are deposited in a Replacement Metal Gate (RMG) trench, which is typically 15 nm to 20 nm wide, and the entire surface area needs to be covered conformally to control the flow of electrons in the FIN channel.

In one example, the conformal work function layer(s) includes a layer of, for example, titanium nitride. In one example, the conformal blanket work-function layer(s) may be formed using, for example, an ALD process.

In a first aspect, disclosed above is a method. The method includes, in a FinFET replacement metal gate process after removal of dummy gate(s), providing a starting semiconductor structure, the starting semiconductor structure including a semiconductor substrate, fin(s) for n-type transistor(s) and fin(s) for p-type transistor(s), each of the fin(s) for the n-type transistor(s) and the fin(s) for the p-type transistor(s) including a partial gate structure surrounding a channel region thereof and dielectric material surrounding source and drain regions thereof, each partial gate structure including spacers and a high-k gate dielectric layer lining gate trenches. The structure is further realized by causing a phase change in each high-k gate dielectric layer, resulting in a phase-changed high-k gate dielectric layer, forming a multi-layer replacement gate stack of n-type work function materials over the phase-changed high-k gate dielectric layer for the fin(s) for the n-type transistor(s), forming a conformal dielectric capping layer in each partial gate structure, and finishing forming the n-type transistor(s) and the p-type transistor(s).

In one example, the high-k gate dielectric layer may include, for example, an oxide. In one example, the oxide of the high-k gate dielectric layer may include, for example, hafnium oxide (HfOx).

In one example, causing the phase change in the method of the first aspect may include, for example, annealing the layer of high-k gate dielectric. In one example, the layer of high-k gate dielectric may include, for example, HfOx.

In one example, the multi-layer replacement gate stack in the method of the first aspect may include, for example, a layer of n-type work function material between two layers of metal. In one example, the layer of n-type work function material may include, for example, titanium aluminum nitride, and the two layers of metal may include, for example, titanium nitride.

In one example, the conformal dielectric capping layer in the method of the first aspect may include, for example, titanium oxide.

In one example, the conformal dielectric capping layer in the method of the first aspect may have, for example, a thickness of about 6 angstroms to about 10 angstroms.

In one example, forming the conformal dielectric capping layer in the method of the first aspect may include, for example, using an atomic layer deposition process.

In a second aspect, disclosed above is a semiconductor structure. The semiconductor structure includes a semiconductor substrate, and n-type and p-type FinFET(s) on the substrate. Each of the n-type FinFET(s) and the p-type FinFET(s) includes a channel region and a gate structure surrounding the channel region, each gate structure having a phase-changed high-k gate dielectric layer lining a gate trench thereof, the gate trench defined by a pair of spacers. The semiconductor structure further includes a conformal dielectric capping layer over each phase-changed high-k gate dielectric layer, the conformal dielectric capping layer having a higher dielectric constant than the phase-changed high-k gate dielectric layer.

In one example, the gate structure of the n-type FinFET(s) may further include, for example, a multi-layer replacement gate stack of n-type work function material.

In one example, the multi-layer replacement gate stack may include, for example, a layer of n-type work function material between two metal layers. In one example, the layer of n-type work function material may include, for example, titanium aluminum nitride, and the two metal layers may include, for example, titanium nitride. In one example, the conformal dielectric capping layer of each gate structure of the n-type FinFET(s) may include, for example, titanium oxide (TiOx).

In one example, the conformal dielectric capping layer may have a thickness of, for example, about 6 angstroms to about 10 angstroms.

In one example, the phase-changed high-k gate dielectric layer in the semiconductor structure of the second aspect may include, for example, a work function oxy-nitride. In one example, the work function oxy-nitride may include, for example, hafnium oxide (HfOx).

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the starting semiconductor structure comprising a semiconductor substrate, at least one fin for at least one n-type transistor and at least one fin for at least one p-type transistor, each of the at least one fin for the at least one n-type transistor and the at least one fin for the at least one p-type transistor comprising a partial gate structure surrounding a channel region thereof and dielectric material surrounding source and drain regions thereof, each partial gate structure comprising spacers and a high-k gate dielectric layer lining gate trenches;
causing a phase change in each high-k gate dielectric layer, resulting in a phase-changed high-k gate dielectric layer;
forming a multi-layer replacement gate stack of n-type work function materials over the phase-changed high-k gate dielectric layer for the at least one fin for the at least one n-type transistor;
forming a conformal dielectric capping layer over the multi-layer replacement gate stack for the at least one n-type transistor and over the phase-changed high-k gate dielectric layer for the at least one p-type transistor, wherein the conformal dielectric capping layer has a dielectric constant higher than that of the phase-changed high-k dielectric layer; and
finishing forming the at least one n-type transistor and the at least one p-type transistor.

2. The method of claim 1, wherein the high-k gate dielectric layer comprises an oxide.

3. The method of claim 2, wherein the high-k gate dielectric layer comprises hafnium oxide (HfOx).

4. The method of claim 1, wherein causing the phase change comprises annealing the high-k gate dielectric layer.

5. The method of claim 4, wherein the high-k gate dielectric layer comprises HfOx.

6. The method of claim 1, wherein the multi-layer replacement gate stack comprises a layer of n-type work function material between two layers of metal.

7. The method of claim 6, wherein the layer of n-type work function material comprises titanium aluminum nitride, and wherein the two layers of metal comprise titanium nitride.

8. The method of claim 1, wherein the conformal dielectric capping layer comprises titanium oxide.

9. The method of claim 1, wherein the conformal dielectric capping layer has a thickness of about 6 angstroms to about 10 angstroms.

10. The method of claim 1, wherein forming the conformal dielectric capping layer comprises using an atomic layer deposition process.

11. A semiconductor structure, comprising:
a semiconductor substrate;
at least one n-type FinFET on the substrate;
at least one p-type FinFET on the substrate;
wherein each of the at least one n-type FinFET and the at least one p-type FinFET comprises a channel region and a gate structure surrounding the channel region, each gate structure having a phase-changed high-k gate dielectric layer lining a gate trench thereof, the gate trench defined by a pair of spacers; and
a conformal dielectric capping layer over each phase-changed high-k gate dielectric layer, wherein the conformal dielectric capping layer has a higher dielectric constant than the phase-changed high-k gate dielectric layer, wherein the n-type FinFET comprises a multi-layer replacement gate stack over the phase-changed high-k dielectric layer, and wherein the conformal dielectric capping layer for the n-type FinFET is over the multi-layer replacement gate stack.

12. The semiconductor structure of claim 11, wherein the gate structure of the at least one n-type FinFET further comprises a multi-layer replacement gate stack of n-type work function material.

13. The semiconductor structure of claim 12, wherein the multi-layer replacement gate stack comprises a layer of n-type work function material between two metal layers.

14. The semiconductor structure of claim 13, wherein the layer of n-type work function material comprises titanium aluminum nitride, and wherein the two metal layers comprise titanium nitride.

15. The semiconductor structure of claim 14, wherein the conformal dielectric capping layer of each gate structure of the at least one n-type FinFET comprises titanium oxide (TiOx).

16. The semiconductor structure of claim 11, wherein the conformal dielectric capping layer has a thickness of about 6 angstroms to about 10 angstroms.

17. The semiconductor structure of claim 11, wherein the phase-changed high-k gate dielectric layer comprises a work function oxy-nitride.

18. The semiconductor structure of claim 17, wherein the work function oxy-nitride comprises hafnium oxide (HfOx).

* * * * *